(12) United States Patent
Adir et al.

(10) Patent No.: US 7,945,888 B2
(45) Date of Patent: May 17, 2011

(54) MODEL-BASED HARDWARE EXERCISER, DEVICE, SYSTEM AND METHOD THEREOF

(75) Inventors: Allon Adir, Kiryat Tivon (IL); Gil Eliezer Shurek, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 12/038,818

(22) Filed: Feb. 28, 2008

(65) Prior Publication Data

US 2009/0222694 A1 Sep. 3, 2009

(51) Int. Cl.
*G06F 17/50* (2006.01)
*G06F 9/44* (2006.01)
*G06F 9/455* (2006.01)
*G06F 11/22* (2006.01)

(52) U.S. Cl. ............. 716/136; 716/106; 703/20; 703/28
(58) Field of Classification Search .............. 716/5, 106, 716/136; 703/23, 26, 28, 13, 20
See application file for complete search history.

(56) References Cited

U.S. PATENT DOCUMENTS

| | | | |
|---|---|---|---|
| 6,925,405 B2 | 8/2005 | Adir et al. | |
| 2003/0093764 A1 | 5/2003 | Devins et al. | |
| 2004/0225973 A1 | 11/2004 | Johnson et al. | |
| 2006/0218513 A1 | 9/2006 | Summars | |
| 2007/0011522 A1 | 1/2007 | Denniston | |
| 2007/0021989 A1* | 1/2007 | de Marcken | 705/5 |
| 2009/0083699 A1* | 3/2009 | Santhanam | 717/107 |

OTHER PUBLICATIONS

Joel Storm, "Random Test Generators for Microprocessor Design Validation", May 12, 2006, 8th EMICRO Porto Alegre, RZ, Brazil.
N. Dohm et al., "Zen and the art of alpha verification", Proceedings—IEEE International Conference on Computer Design: VLSI in Computers and Processors, VLSI in Computers and Processors, 1998, p. 111-117.
A. Adir et al., "Genesys-Pro: innovations in test program generation for functional processor verification", IEEE Design & Test of Computers, v 21, n 2, Mar.-Apr. 2004, 84-93.
L. Fournier, "Deep Knowledge Test Generators & Functional Verification Methodology", (Source: http://www.haifa.ibm.com/Workshops/verification2003/papers/Laurent.pdf).
M. Behm et al., "Industrial Experience with Test Generation Languares for Processor Verification", DAC '04, Jun. 7-11, 2004, San Diego, CA USA.

* cited by examiner

*Primary Examiner* — Stacy A Whitmore

(57) ABSTRACT

Device, system and method for verification of a hardware system-under-test including at least one processor. A method includes building an executable image of a hardware exerciser adapted for execution on a test platform selected from: a simulation accelerator, a hardware emulator, a prototype hardware system, and a hardware production wafer. The exerciser image includes embedded data corresponding to architectural knowledge, testing knowledge, and a test template. The test template is defined in a context-free formal language and includes biasing directives to influence at least one of a desired test structure, one or more resources to be included in the test, and one or more values of the included resources. The architectural knowledge is obtained from an architectural model including a formal description of the specification for the system-under-test, and the testing knowledge is obtained from a testing knowledgebase including heuristics for testing desired aspects of the system-under-test.

19 Claims, 2 Drawing Sheets

MODEL-BASED HARDWARE EXERCISER, DEVICE, SYSTEM AND METHOD THEREOF

FIELD

Some embodiments of the invention relate to verification and/or testing of hardware systems, and in particular of processor and multiprocessor systems.

BACKGROUND

An "exerciser" is a program designed to run on a processor system-under-test, or on a software (SW) simulator or a hardware (HW) emulator of the system-under-test, with the object of testing for "bugs" on the processor or its environment. That is, the exerciser may explore the functionality of the system-under-test and verify whether it performs according to its design specification, with the object of identifying cases of erroneous behavior.

Some testing environments present challenges in designing an efficient exerciser, for example, exercisers that are to be used on a HW accelerator, on the HW itself in its prototype "bring-up" stages, or on a wafer for production testing. In these environments, the exerciser is a "stand-alone" tool to be run "bare-metal", that is, with no operating system (OS) present and with unrestricted machine access. Such a usage model imposes restrictions on the size and performance parameters of the exerciser. For example, an appropriate exerciser for these environments should have a small memory footprint in order to fit on a cache memory of the wafer, should be simple enough to run on a prototype system, and should support high test throughput, e.g., for an accelerator. Due to these restrictions, conventional pre-silicon testing and validation tools are less adaptable for hardware emulators, hardware accelerators and post-silicon testing environments.

For example, one pre-silicon approach similar in concept to a post-silicon hardware exerciser is a test-program generator, which runs on a server machine under an OS and produces a test program that is later loaded on a simulator of the tested processor. The test-generator approach assumes a separate environment for the generation of the test, e.g., the server machine, and for execution of the test, e.g., the simulator. However, employing a similar approach for hardware exercisers in acceleration, prototype, and/or wafer environments would incur a high price in performance due to the communication overhead between the generating and executing environments.

There are some examples of stand-alone bare-metal exercisers that perform both the test generation and execution and thus do not incur this communication overhead. Rather than separately generating a test file that is subsequently loaded into memory on a simulator, the exercisers generate tests directly in memory and then branch to a test area to perform the actual test. However, these existing, conventional exercisers have several disadvantages.

One disadvantage is that the user has very little control over the tests generated by a conventional exerciser, and the little control that is available may be difficult to specify. For example, user control is often only through a table of instructions that is compiled into the exerciser image. The user can replace the entire table of available instructions and thereby control the instruction distribution in the generated tests. However, such control is too poor to enable a coverage-driven verification methodology that uses the exerciser tool to target specific sections of a verification plan.

Another disadvantage is that conventional exercisers are written specifically for a particular design. Therefore, large parts of the exerciser often need to be rewritten to adapt the exerciser for a new processor design. In addition, a system design commonly goes through several changes as it is being verified and therefore parts of the exerciser often need to be rewritten multiple times even for the same processor. This increases the price of maintenance.

The foregoing examples of the related art are intended to be illustrative and not exclusive. Other disadvantages of the related art may become apparent to those of skill in the art upon a reading of the specification and a study of the figures.

SUMMARY

Some embodiments of the invention include devices, systems and methods for functional verification of a hardware system-under-test including at least one processor. For example, a functional-coverage oriented hardware exerciser for processors and multiprocessor systems in post-silicon stages of development.

One aspect described herein is of a directable hardware exerciser. In some embodiments, a method includes defining a test template in a context-free formal language, for directing a randomly-generated test of the hardware system-under-test, wherein the test template includes biasing directives to influence at least one of: a desired test structure, one or more resources of the system to be included in the test, and one or more values of the included resources. Biasing directives may also be used to influence the occurrence of architectural or micro-architectural events, and/or to influence the activation of testing knowledge.

Another aspect described herein is of a model-based hardware exerciser. In some embodiments, a method includes obtaining architectural knowledge of the system-under-test from an ontology-based architectural model that includes a formal description of the specification for the system, and obtaining testing knowledge of the system-under-test from a testing knowledgebase including heuristics for testing desired aspects of the system. The method may further include obtaining a description of the topology and configuration setup of the hardware system-under-test from a configuration file.

Some demonstrative embodiments of the invention provide a computer program product including a computer readable builder program which, when executed on a computer, causes the computer to build an executable image of a hardware exerciser for controlling a test cycle of a system-under-test, the exerciser image including embedded data corresponding to architectural knowledge of the system-under-test, testing knowledge of the system-under-test, and a test template for the system-under-test.

In some embodiments, the builder program may be adapted to optimize a size of the hardware exerciser image by selecting only a portion of the architectural model and of the testing knowledgebase to include in the embedded data, the selected portion including data relevant for supporting the test template in order to generate a test for the system-under-test. The executable hardware exerciser image may be adapted for execution on a test platform selected from the group consisting of: a simulation accelerator, a hardware emulator, a prototype hardware system, and a hardware production wafer.

Use of a test template language with a hardware exerciser in accordance with embodiments of the invention may allow a user a great degree of control and specificity in directing the random generation of tests. Use of an ontology-based model with a hardware exerciser in accordance with embodiments of the invention may allow the exerciser to be a generic tool independent of knowledge specific to a particular design.

Embodiments of the invention may provide other and/or additional benefits and/or advantages.

BRIEF DESCRIPTION OF THE DRAWINGS

The subject matter regarded as the invention is particularly pointed out and distinctly claimed in the concluding portion of the specification. Embodiments of the invention, however, both as to organization and method of operation, together with features and advantages thereof, may best be understood by reference to the following detailed description when read with the accompanied drawings in which:

Figure 1:
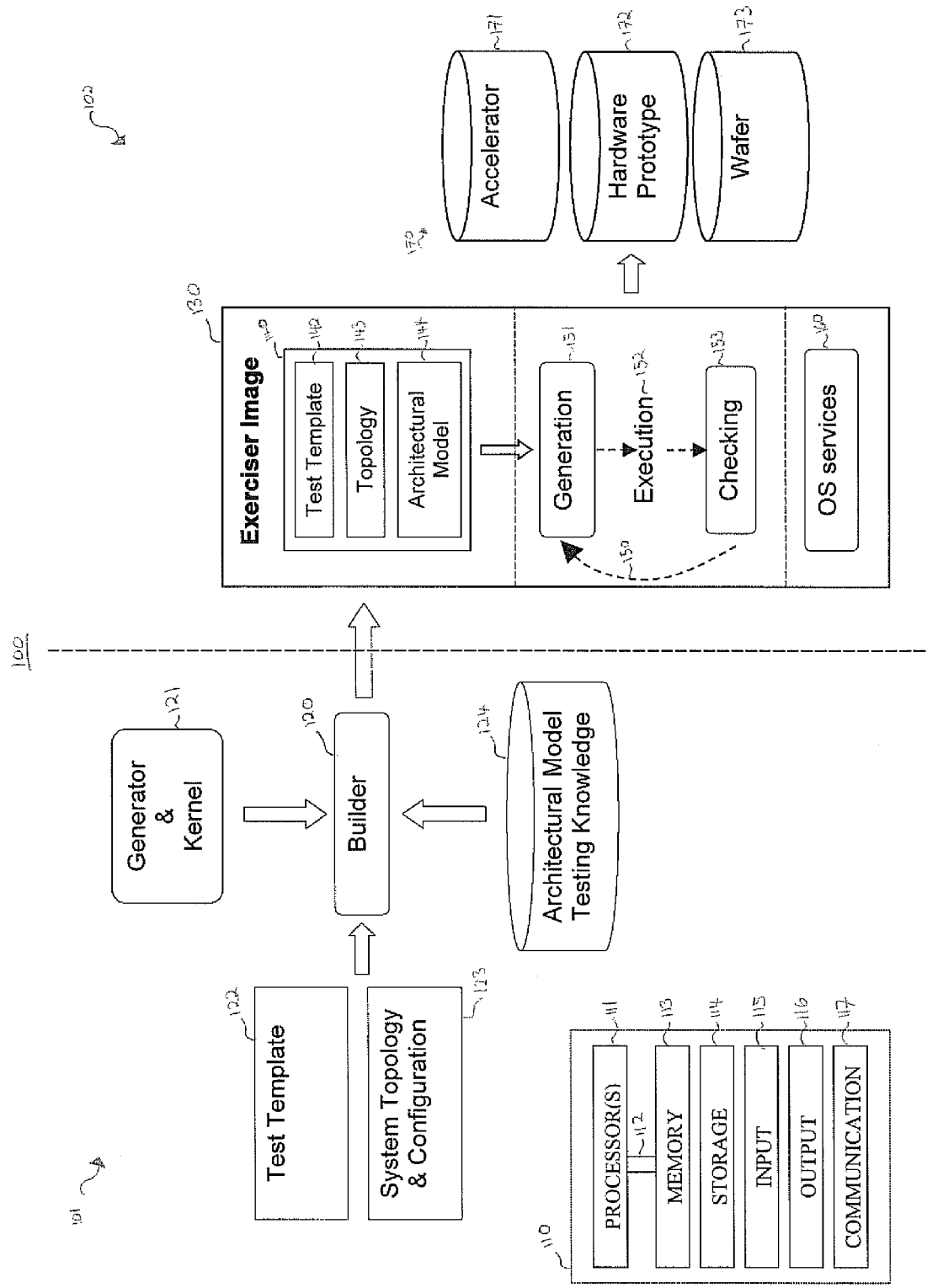
FIG. 1 is a schematic block diagram illustration of a system in accordance with a demonstrative embodiment of the invention.

For simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements. Moreover, some of the blocks depicted in the drawings may be combined into a single function.

DETAILED DESCRIPTION

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion. It is intended that the embodiments and figures disclosed herein be considered illustrative rather than restrictive.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like. For example, a plurality of data members may include two or more data members.

Embodiments of the present invention may include apparatuses or modules for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus. A "module" may be implemented using any suitable combination of software, hardware, memory, hardwired logic, and/or general-purpose or special-purpose processors, to provide a desired functionality.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language, scripting language and/or modeling language. It will be appreciated that a variety of such languages may be used to implement the teachings of the inventions as described herein.

Some embodiments of the invention are described herein in the context of a functional-coverage oriented hardware exerciser for processors and multiprocessor systems, particularly for post-silicon and acceleration platforms, although embodiments of the invention are not limited in this respect. For example, in addition to functional verification, some embodiments of the invention may relate to exercisers for performance verification and/or to exercisers for power verification. In accordance with embodiments of the invention, the exerciser tool is designed to provide extensive user control while keeping the generation code simple enough to be useful for acceleration platforms. For example, the exerciser may be model-based, in that it includes a generic core and receives knowledge of the target architecture from an external model.

In some embodiments, the exerciser may be designed to run on a possibly highly multi-processor and/or multi-threaded system, with an objective of finding and recreating functional bugs. The exerciser may be a bare-metal tool, in the sense that it does not rely on operating system facilities, and can be loaded and run, standalone, on the testing environment (e.g., a simulator, hardware accelerator, or silicon) and "exercises" the design by testing interesting scenarios directly on it. A continuous process of generating, running, and checking the validity of random biased test programs exercises the design being tested. The generated test programs may be structured according to a user-defined test template written in a context-free test template language.

A non-limiting list of hardware exercisers having features in accordance with embodiments of the invention includes: Exercisers designed to target instruction-architecture based processors, including multithreading and multiprocessor systems; Exercisers applicable to hardware accelerators, emulators, and post-silicon test platforms such as hardware prototypes and production wafers; Exercisers utilizing a biased random generation scheme, to generate and run tests on the verified platform; Exercisers adapted for execution on a bare-silicon environment with no OS present and unrestricted machine access; Exercisers adapted to use a self-check method, e.g., reference-model, consistency between runs, or test-specific checks; Exercisers adapted to use a test-specific validation mechanism specified in the test-template; Exercisers adapted to include user direction through a test-template, e.g., per-thread; Exercisers that deploy an extensive test-template language as a prime method to direct the random creation of the test programs; Exercisers that are generic and/or model-based, e.g., adapted to use an external model of the architecture, a testing-knowledgebase, and a system-configuration and topology description as an input.

In some embodiments, a model-based exerciser may be oblivious to specific knowledge of the instruction architecture, the system topology, and/or any architecture or micro-architecture specific testing knowledge. For example, a builder module may automatically construct an executable image of the exerciser that embeds all the necessary architectural, system, and testing knowledge. Such knowledge may be extracted from an ontology-based model holding a description of the instruction architecture and the applicable testing knowledge, and from a configuration file specifying system configuration and topology data.

Reference is made to FIG. 1, which schematically illustrates a system 100 for verification of a hardware system-under-test in accordance with a demonstrative embodiment of the invention. A non-limiting list of hardware designs-under-test includes, for example, designs of a processor, a multiprocessor, a controller, a CPU, a DSP, a bus-bridge, a circuit, an integrated circuit, a direct memory access (DMA) controller, or the like. System 100 may be logically separated into a building environment 101 and a testing environment 102. In the building environment 101, a builder 120 takes various user directives and produces a corresponding code image 130 of an exerciser in the testing environment 102, which can then be loaded and run on an emulator 170 and monitored for potential failures.

To perform the build process and produce exerciser image 130, builder 120 may rely on input from one or more of the modules such as test template 122, system topology and configuration module 123, and architectural model and testing knowledgebase 124. Builder 120 may also compile data and/or code from generator and kernel module 121 into the exerciser image. Building environment 101 may optionally be implemented or may operate, for example, using a computing system 110, such as, for example, a computer, a personal computer (PC), a server computer, a computing device, a computing platform, a client/server system, a mobile computer, a portable computer, a laptop computer, a notebook computer, a tablet computer, or the like. Computing system 110 may include, for example, one or more processors 111, a system bus 112, a memory unit 113, a storage unit 114, an input unit 115, an output unit 116, and a communication unit 117. Computing system 110 may optionally include other suitable hardware components and/or software components.

In some embodiments, generator and kernel module 121 may include code to allow exerciser image 130 to perform a test cycle 150 of generation 151, execution 152, and checking 153. Generator and kernel module 121 may further include code to provide light operating system (OS) services 160 for the exerciser image, such as loading the image, context switching, various system queries, and the like. The system and method described herein is adapted to check the design of the system-under-test in a pure "bare metal" form by running test cycle 150 directly on the tested system, including both the generation and the testing. As used herein, the term "bare metal" refers to execution having direct unrestricted machine access without an intervening operating system.

Test template 122 allows a user to specify a desired test structure. The test template is defined in a context-free formal language and includes biasing directives to influence at least one of: a desired test structure, one or more resources to be included in the test, and one or more values of the included resources. For example, test template 122 may specify a load instruction, and exerciser 130, when generating a test according to the template, may randomly select a specific load form, registers, memory address, and data to be used by the load instruction. The biasing directives may also influence the occurrence of specific architectural or micro-architectural events during test execution 152. Further, many of these random decisions may be biased towards values that are more interesting for verification purposes. In some embodiments, the biasing directives may also influence activation of the testing knowledge included in architectural model 144.

In some embodiments, the test-template language may express a potentially infinite variety of test-sets, for example, by following a context-free grammar that supports a description of a stream of instructions or a general scenario. Test template 122 may describe a set of tests for the biased random generation, and may assign some of the tests from the set a higher probability of being generated than other tests. For example, test template 122 may include an instruction stream description together with biasing and instruction-level templates and, optionally, a specification of a validation routine to be used.

For example, the instruction stream may include a description of the number of instructions or cycles, of instruction groups, of participating instructions, of repeated template-blocks, of alternative template blocks for selection, of relative weights for the selection alternatives, of loops, branches, and/or macros, and the like. In some embodiments, the instruction stream description may be provided as a per-thread specification. The biasing and instruction-level templates may include a description of, for example, an instruction-field specification and constraints over the instruction fields, desired architectural or micro-architectural events such as exceptions or interrupts, limiting of undesired interrupts or other events, resource interdependency including specific registers, addresses, and/or cache lines to be accessed or avoided, locality of accesses depending on configuration, control of floating-point register data, and the like. The optional validation method specification may include, for example, a validation routine that checks a predictable aspect that is specific to the test-programs generated from the template. In accordance with embodiments of the invention, the test template may express the above information in a relatively compact manner.

Optionally, system topology and configuration module 123 may provide information to builder 120 regarding the system structure to be tested. For example, this may include information regarding the number of nodes, cores, processors, and/or active threads, processor clustering information, available memory per cluster, and the like.

Architectural model and testing knowledgebase 124 may include a formal description of the verified architecture for which the exerciser is needed, as well as heuristics for testing desired aspects of the system-under-test, e.g., in the form of a formal declarative description, or code and template libraries that can be incorporated into the generated tests. The model is available to users for both reading and updating and enables the user to create an instance of the tool, e.g., using builder 120, that is appropriate to the tested architecture. Accordingly, exerciser 130 may be a model-based exerciser built in an architecture-independent manner and that receives relevant information about the architecture from an external model, e.g., from architectural model 124. The model includes a declarative description of the architecture, as well as architecture-specific expert testing knowledge.

In some embodiments, model 124 may hold details that are required for generating valid, high-quality test-programs. Model 124 may include system hierarchy rules, instruction-types, resource-initialization rules, and any architecture- or implementation-dependent testing-knowledge and biasing option provided to the user. For example, such a model may be created per implementation of a processor-based hardware system.

In some embodiments, architectural model 124 may be defined using a specialized hierarchy of modeling building blocks that establishes a modeling terminology for the test-program-generation problem. For example, model 124 may be defined using a type definition language where each type represents an abstract concept or a target domain class. An ontology-based model describing a specific design, e.g., architectural model 124, may then be developed by refining the pre-defined building blocks such as, e.g., Instruction, Operand, Resource, and Address, thereby creating the knowledgebase that drives the generation engine. For example, an instruction may be modeled at the semantic-level of the processor architecture by listing its operands and specifying their inter-relations. Each operand may be composed of attributes that describe the properties of the operand, and the values they may accept as input, for example: Resource, Address, Data, Sense, NumberOfUnits, Suboperands. Additional relations may describe how semantic entities (e.g., Address) are tied to the syntactic entities (e.g., machine-code fields).

In some embodiments, model and knowledgebase 124 may include a description of the design to be tested, its expected behavior, and expert testing knowledge regarding the design. For example, testing-knowledge heuristics may be modeled through data-classification or data-types, constraints and generation-functions that influence generation decisions (which may be controlled by the user through test-template 122), and fine-tuning of the generation scheme through biasing weights and default values.

In accordance with embodiments of the invention, builder module 120 compiles inputs from modules 121, 122, 123, and 124 to produce an executable image 130 of the desired exerciser. Exerciser image 130 incorporates a compact representation in memory 140 of the main inputs described above. For example, exerciser image 130 may include embedded data 144 representing architectural knowledge and testing knowledge of the system-under-test, embedded data 143 representing the topology and configuration setup for the system-under-test, and embedded data 142 representing the test template 122. Builder 120 may optimize a size of hardware exerciser image 130 by selecting only a relevant portion of architectural model and of said testing knowledgebase 124 to include in the embedded data 140.

In testing environment 102, exerciser image 130 may be loaded onto a test platform 170 such as, for example, an accelerator 171, a hardware prototype 172, or a wafer 173. Exerciser 130, supported by minimal OS services 160, may then control a test cycle 150 including generation 151, execution 152, and checking 153 of random-biased generated tests.

Generation 151 may follow a scheme provided by the test template data 141 to generate any number of random tests that satisfy the template. Any aspect of the test that is not decided by the test-template (e.g., left unspecified or just partially constrained) may be randomly decided by the generation scheme. The random decisions should satisfy the test-template constraints specified in template data 142 and the architectural constraints specified in the architectural model and topology data 144 and 143. For example, the uniformity of the random decisions may be biased either by user directives included in the test template or by default testing knowledge.

In the case of a multithreaded processor or a multiprocessor system, tests may be generated either by a monarch thread or in a distributed process where each thread generates its own test program. Where a test is generated per-thread, the tests may be based on different requested test templates.

Checking 153 may follow any suitable validation routine or method. A non-limiting list of checking methods for use in accordance with embodiments of the invention includes hardware-implemented traps, a dual-pass approach, comparing test results to a reference model, checking for specific predictable results, and the like. For example, in some embodiments test template 142 may include the results to be verified.

A dual pass checking method may include executing each generated test twice, recording the results of the executions, and comparing for consistency. In one example, the two executions 153 may be set to differ only in their respective micro-architecture scheduling. In some embodiments, a multiple test pass variation may be used. The passes may be scheduled with random delays or in a synchronized lock-step mode. In one example, a reference pass may be executed in trace mode to provide additional accuracy. Additionally or alternatively, an external monitoring mechanism may be implemented.

Figure 2:
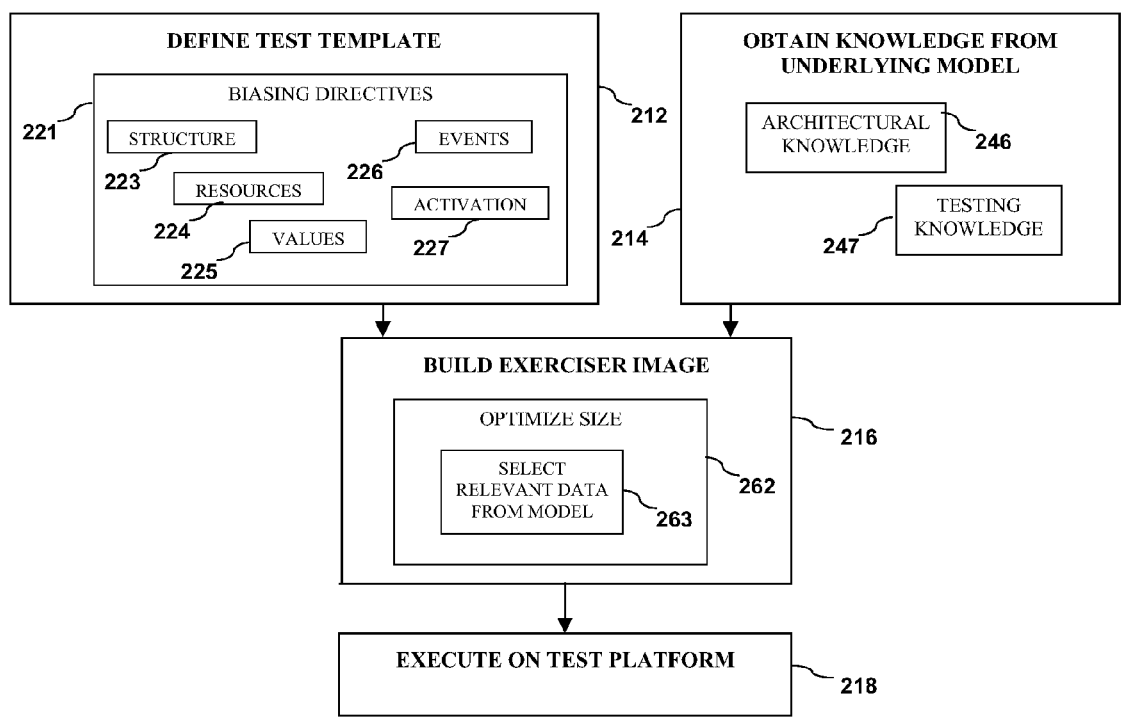
FIG. 2 is a schematic flow-chart of a method in accordance with a demonstrative embodiment of the invention.

FIG. 2 outlines a method for verification of a hardware system-under-test including at least one processor as described herein. In some embodiments, the method includes defining a test template (212) and/or obtaining model-based knowledge (214), building an exerciser image therefrom (216), and executing the exerciser on a test platform (218). Other operations or sets of operations may be used in accordance with some embodiments of the invention.

The test template may be defined in a context-free formal language, for directing a randomly-generated test of the hardware system-under-test. In some embodiments, the test template may include biasing directives (221) to influence, for example, a desired test structure (223), one or more resources of the system-under-test to be included in the test (224), and/or one or more values of the included resources (225).

The underlying model and/or knowledgebase may include architectural knowledge (246) and testing knowledge (247). The activation of testing knowledge 247 may be controlled by biasing directives (227). The occurrence of some architectural or micro-architectural events may be influenced by biasing directives (226), e.g., used together with architectural knowledge 246. In some embodiments, the architectural knowledge is obtained from an architectural model including a formal description of the specification for the system-under-test, and the testing knowledge is obtained from a testing knowledgebase including heuristics for testing desired aspects of the system-under-test. Building the exerciser image may include optimizing for size (262), for example, by selecting only model-based data relevant for supporting the desired test template (263).

In accordance with some demonstrative embodiments of the invention, building the exerciser image (216) may be independent of and without any specific system-architecture, testing-knowledge, configuration and/or topology. For example, referring to FIG. 1, builder program 120 may combine generic, system-oblivious code, e.g., provided by generator and kernel module 121, with system-specific knowledge extracted from an external model and/or knowledgebase, e.g., architectural model and testing knowledgebase 124.

The exerciser image created by the builder is adapted to control and to implement a test cycle of the system-under-test. In some embodiments, executing the exerciser image on the test platform (218) includes generating one or more valid tests for the system-under-test that satisfy the given test template, executing the tests, and checking the results. The exerciser image is able to generate valid, high-quality tests for any system-under-test by using the system-specific knowledge provided by the underlying model, and to control the test cycle according to the biasing directives provided by the test template.

Some embodiments of the invention may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid-state memory, magnetic tape, a removable computer diskette, a random access memory (RAM), a read-only memory (ROM), a rigid magnetic disk, and an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes.

What is claimed is:

1. A method for verification of a hardware system-under-test including at least one processor, the method comprising:
building an executable image of a hardware exerciser, wherein the hardware exerciser is adapted to control a test cycle of the hardware system-under-test, wherein the test cycle comprises at least generation and execution of a test; said building comprises embedding in the executable image data corresponding to:
architectural knowledge of the system-under-test,
testing knowledge of the system-under-test, and
a test template for the system-under-test,
wherein said test template is defined in a formal language and includes biasing directives to control one or more parameters of a randomly generated test of said system-under-test;
wherein said building further comprises storing the executable image in a non-transitory computer readable medium; and
wherein said executable image of the hardware exerciser is configured to be executed by the hardware system-under-test.

2. The method of claim 1, wherein said biasing directives control at least one parameter selected from the group consisting of: a desired test structure, one or more resources of the system-under-test to be included in said test, one or more values to be assigned to said resources, occurrence of one or more architectural or micro-architectural events during said test, and activation of testing knowledge relating to the system-under-test.

3. The method of claim 1, wherein said architectural knowledge is obtained from an architectural model including a formal description of the specification for said system-under-test, and wherein said testing knowledge is obtained from a testing knowledgebase including heuristics for testing desired aspects of said system-under-test.

4. The method of claim 3, comprising selecting only a portion of said architectural model and of said testing knowledgebase to embed as data in said executable image, said selected portion including data relevant for supporting said test template to generate a test for the system-under-test; and whereby a size of the executable image of the hardware exercised is reduced.

5. The method of claim 1, comprising embedding in said executable image of the hardware exerciser data corresponding to a description of a topology and a configuration setup of said hardware system-under-test, said data obtained from a system configuration file.

6. The method of claim 1, comprising executing said executable image of the hardware exerciser on a test platform to implement said test cycle, and wherein implementing said test cycle includes randomly generating a test that satisfies said test template, executing said test, and validating said execution; and wherein the test platform is selected from the group consisting of: a hardware simulation accelerator, a hardware emulator, a prototype hardware system, and a hardware production wafer.

7. The method of claim 1, wherein the executable image comprises a code operative to provide light Operating System (OS) services for the executable image.

8. The method of claim 1, further comprising:
loading the executable image on a post-silicon test platform; and
executing the executable image by the post-silicon test platform, wherein the execution of the executable image having unrestricted machine access.

9. The method of claim 1, further comprising obtaining the architectural knowledge of the system-under-test from an architectural model including a formal description of the specification for said system-under-test.

10. The method of claim 1, further comprising obtaining testing knowledge of the system-under-test from a testing knowledgebase including heuristics for testing desired aspects of said system-under-test.

11. The method of claim 1, wherein the hardware exerciser is a bare-metal tool.

12. A system for verification of a hardware system-under-test including at least one processor, the system comprising:
- a processing unit;
- a computer readable medium, wherein the computer readable medium having stored thereon:
  - an architectural model including a formal description of the specification for said system-under-test;
  - a testing knowledgebase including heuristics for testing desired aspects of said system-under-test;
  - a test template defined in a formal language, said test template including biasing directives to control one or more parameters of a randomly generated test of said system-under-test; and
  - a builder program, wherein the builder program, when executed by the processing unit, causes the processing unit to build an executable image of a hardware exerciser to control a test cycle of said system-under-test, wherein the test cycle comprises at least generation and execution of a test, wherein building said exerciser image includes embedding data corresponding to architectural knowledge of the system-under-test obtained from said architectural model, testing knowledge of the system-under-test obtained from said testing knowledgebase, and said test template.

13. The system of claim 12, wherein said biasing directives control at least one parameter selected from the group consisting of: a desired test structure, one or more resources of the system-under-test to be included in said test, one or more values to be assigned to said resources, occurrence of one or more architectural or micro-architectural events during said test, and activation of testing knowledge relating to the system-under-test.

14. The system of claim 12, wherein said builder program is adapted to select only a portion of said architectural model and of said testing knowledgebase to embed as data in said executable image, said selected portion including data relevant for supporting said test template to generate a test for the system-under-test; and whereby said builder program is adapted to reduce a size of said executable image of the hardware exerciser.

15. The system of claim 12, wherein said computer readable medium having stored thereon a system configuration file for said hardware system-under-test, and wherein building said exerciser image comprises embedding data corresponding to a description of the topology and configuration setup of said hardware system-under-test obtained from said system configuration file.

16. The system of claim 12, wherein said executable image of the hardware exerciser, when executed on a test platform, configured to implements said test cycle, and wherein implementing said test cycle includes randomly generating a test that satisfies said test template, executing said test, and validating said execution.

17. The system of claim 16, the test platform is selected from the group consisting of: a hardware simulation accelerator, a hardware emulator, a prototype hardware system, and a hardware production wafer.

18. A computer program product for verification of a hardware system-under-test including at least one processor, said computer program product comprising:
- a non-transitory computer readable medium;
- a first program instruction operative to obtain architectural knowledge of the system-under-test from an architectural model including a formal description of the specification for said system-under-test;
- a second program instruction operative to obtain testing knowledge of the system-under-test from a testing knowledgebase including heuristics for testing desired aspects of said system-under-test;
- a third program instruction operative to obtain a test template for the system-under-test, wherein the test template is defined in a formal language and includes biasing directives to control one or more parameters of a randomly generated test of said system-under-test;
- a fourth program instruction operative to build an executable image of a hardware exerciser to control a test cycle of said system-under-test, wherein the test cycle comprises at least generation and execution of a test, wherein building said executable image includes embedding data corresponding to said architectural knowledge, said testing knowledge, and a test template for the system-under-test;
- wherein said first, second, third and, fourth program instructions are stored on said non-transitory computer readable media.

19. The computer program product of claim 18, further comprising:
- a fifth program instruction operative to reduce a size of said executable image of the hardware exerciser by selecting a portion of said architectural model and of said testing knowledgebase to embed as data in said executable image, said selected portion including data relevant for supporting said test template to generate a test for the system-under-test; and
- wherein said fifth program instruction is stored on said non-transitory computer readable medium.

* * * * *